US009047855B2

(12) United States Patent
Bakalos

(10) Patent No.: US 9,047,855 B2
(45) Date of Patent: Jun. 2, 2015

(54) PRESSURE-RELATED FEEDBACK INSTABILITY MITIGATION

(75) Inventor: Pericles N. Bakalos, Maynard, MA (US)

(73) Assignee: Bose Corporation, Framingham, MA (US)

( * ) Notice: Subject to any disclaimer, the term of this patent is extended or adjusted under 35 U.S.C. 154(b) by 442 days.

(21) Appl. No.: 13/492,047

(22) Filed: Jun. 8, 2012

(65) Prior Publication Data

US 2013/0329902 A1 Dec. 12, 2013

(51) Int. Cl.

| | |
|---|---|
| ***G10K 11/16*** | (2006.01) |
| ***G10K 11/178*** | (2006.01) |
| ***H04R 1/10*** | (2006.01) |
| *H03B 29/00* | (2006.01) |

(52) U.S. Cl.

CPC ............ *G10K 11/178* (2013.01); *H04R 1/1083* (2013.01); *G10K 2210/1081* (2013.01)

(58) Field of Classification Search

CPC ..... H04R 1/1058; H04R 1/105; H04R 1/1016
USPC ............ 381/71.1–71.8, 94.1–94.9, 380–384, 381/317, 322, 328, 23.1, 58, 74; 455/556.1
See application file for complete search history.

(56) References Cited

U.S. PATENT DOCUMENTS

| | | | | |
|---|---|---|---|---|
| 6,252,529 | B1 * | 6/2001 | Bolda et al. | 341/139 |
| 6,683,965 | B1 | 1/2004 | Sapiejewski | |
| 7,103,188 | B1 | 9/2006 | Jones | |
| 2010/0274564 | A1 | 10/2010 | Bakalos et al. | |
| 2011/0243343 | A1 | 10/2011 | Gauger, Jr. et al. | |
| 2011/0243344 | A1 | 10/2011 | Bakalos et al. | |
| 2011/0243345 | A1 | 10/2011 | Carreras et al. | |

FOREIGN PATENT DOCUMENTS

| | | | |
|---|---|---|---|
| WO | 2010/129272 | A1 | 11/2010 |
| WO | 2010131154 | A1 | 11/2010 |
| WO | WO 2010129272 | A1 * | 11/2010 |
| WO | 2013052327 | A2 | 4/2013 |
| WO | 2013151918 | A1 | 10/2013 |

OTHER PUBLICATIONS

International Search Report and Written Opinion dated Jan. 7, 2014 for International applicaton No. PCT/US2013/042232.

U.S. Appl. No. 13/251,725, filed Oct. 3, 2011, Bakalos, et al.

* cited by examiner

*Primary Examiner* — Vivian Chin
*Assistant Examiner* — Ammar Hamid

(57) ABSTRACT

An apparatus includes a member configured to form an acoustic seal around a portion of an acoustic environment, and active noise reduction circuitry. The active noise reduction circuitry includes: detection circuitry configured to detect a change in pressure within the acoustic environment caused by movement of the member, and gain compensation circuitry configured to change a loop gain of a feedback loop in response to the detected change in pressure.

20 Claims, 4 Drawing Sheets

PRESSURE-RELATED FEEDBACK INSTABILITY MITIGATION

BACKGROUND

This description relates to pressure-related feedback instability mitigation, for example, in an active noise reduction system.

The presence of ambient acoustic noise in an environment can have a wide range of effects on human hearing. Some examples of ambient noise, such as engine noise in the cabin of a jet airliner, can cause minor annoyance to a passenger. Other examples of ambient noise, such as a jackhammer on a construction site can cause permanent hearing loss. Techniques for the reduction of ambient acoustic noise are an active area of research, providing benefits such as more pleasurable hearing experiences and avoidance of hearing losses.

Some noise reduction systems utilize active noise reduction techniques to reduce the amount of noise that is perceived by a user. Active noise reduction (ANR) systems can be implemented using feedback approaches. Feedback based ANR systems typically measure a noise sound wave, possibly combined with other sound waves, near an area where noise reduction is desired (e.g., in an acoustic cavity such as an ear cavity). In general, the measured signals are used to generate an "anti-noise signal," which is a phase inverted and scaled version of the measured noise. The anti-noise signal is provided to a noise cancellation driver, which transduces the signal into a sound wave that is presented to the user. When the anti-noise sound wave produced by the noise cancellation driver combines in the acoustic cavity with the noise sound wave, the two sound waves cancel one another due to destructive interference. The result is a reduction in the noise level perceived by the user in the area where noise reduction is desired.

Feedback systems generally have the potential of being unstable and producing instability based distortion. In feedback systems, the input to a system being controlled (called the "plant") is provided by forming a feedback loop that compares the output of the plant to a desired input or reference signal. One or more compensators within the feedback loop provide gain over a particular frequency spectrum to drive the difference between the output and desired input near zero over that frequency spectrum. Instability may result if the gain of a feedback loop is greater than 1 at a frequency where the phase of the feedback loop is 180°.

SUMMARY

In one aspect, in general, an apparatus includes: a member configured to form an acoustic seal around a portion of an acoustic environment, and active noise reduction circuitry. The active noise reduction circuitry includes: detection circuitry configured to detect a change in pressure within the acoustic environment caused by movement of the member, and gain compensation circuitry configured to change a loop gain of a feedback loop in response to the detected change in pressure.

Aspects can include one or more of the following features.

The detection circuitry comprises circuitry that processes a signal representative of a pressure change to distinguish between a pressure change caused by an external noise sound and a pressure change caused by movement of the earpiece.

The detection circuitry comprises circuitry that compares a signal representative of a pressure change to a threshold that is selected to distinguish between a pressure change caused by an external noise sound and a pressure change caused by movement of the earpiece.

The circuitry that compares a signal representative of a pressure change to a threshold is configured to receive a signal from a first location within the feedback loop and compare a signal derived from the received signal to the threshold, and the gain compensation circuitry comprises a variable gain component within the feedback loop.

The detection circuitry comprises a low-pass filter that filters a signal representative of a pressure change, with a cutoff frequency selected to distinguish between a pressure change caused by an external noise sound and a pressure change caused by movement of the earpiece.

The detection circuitry comprises: a first component that receives a signal from a first location within the feedback loop; and a second component that compares a signal derived from the received signal to a threshold.

The gain compensation circuitry comprises a variable gain component within the feedback loop.

The first component comprises a full wave rectifier.

The member comprises an earpiece configured to form an acoustic seal around an outer portion of an ear canal, and the acoustic environment comprises a cavity within the member and the ear canal.

A portion of the earpiece configured to form an acoustic seal has a shape configured to form an acoustic seal.

The portion of the earpiece configured to form an acoustic seal has a conical shape.

A portion of the earpiece configured to form an acoustic seal consists essentially of a shape conforming material.

In another aspect, in general, a method controls active noise reduction in an acoustic environment that includes an apparatus comprising a member configured to form an acoustic seal around a portion of the acoustic environment. The method includes: detecting a change in pressure within the acoustic environment caused by movement of the member, and controlling a loop gain of a feedback loop in response to the detected change in pressure.

Aspects can include one or more of the following features.

Detecting the change in pressure comprises processing a signal representative of a pressure change to distinguish between a pressure change caused by an external noise sound and a pressure change caused by movement of the earpiece.

Detecting the change in pressure comprises comparing a signal representative of a pressure change to a threshold that is selected to distinguish between a pressure change caused by an external noise sound and a pressure change caused by movement of the earpiece.

Comparing a signal representative of a pressure change to a threshold comprises receiving a signal from a first location within the feedback loop and comparing a signal derived from the received signal to the threshold, and controlling the loop gain includes using a variable gain component within the feedback loop.

Detecting the change in pressure comprises low-pass filtering a signal representative of a pressure change, with a cutoff frequency selected to distinguish between a pressure change caused by an external noise sound and a pressure change caused by movement of the earpiece.

Detecting the change in pressure comprises: a first component receiving a signal from a first location within the feedback loop, and a second component comparing a signal derived from the received signal to a threshold.

Controlling the loop gain includes using a variable gain component within the feedback loop.

The first component comprises a full wave rectifier.

The member comprises an earpiece that forms an acoustic seal around an outer portion of an ear canal, and the acoustic environment comprises a cavity within the member and the ear canal.

A portion of the earpiece that forms an acoustic seal has a shape configured to form an acoustic seal.

The portion of the earpiece that forms an acoustic seal has a conical shape.

A portion of the earpiece that forms an acoustic seal consists essentially of a shape conforming material.

Aspects can have one or more of the following advantages.

The noise reduction techniques described herein facilitate feedback instability mitigation for pressure-related disturbances without significantly sacrificing overall noise attenuation performance. For example, by including a pressure-related disturbance (PRD) detector within active noise reduction circuitry, the loop gain can be temporarily decreased to mitigate instability associated with a pressure-related disturbance and then increased again after the disturbance to restore full noise reduction performance. The long-term loop gain can be maintained at a relatively high level during normal operation without a significant risk of pressure-related disturbances (e.g., over-pressure or under-pressure disturbances) causing feedback instability. Additionally, a pressure equalization (PEQ) hole that is designed to reduce some pressure-related disturbances can be configured to provide less pressure equalization in favor of providing more low frequency plant output and higher passive attenuation (e.g., lower transmission from the environment through an outer cavity port and from an inner cavity to the outer cavity through the PEQ hole). In particular, the acoustic impedance of the PEQ hole can be kept relatively large (e.g., by providing a relatively small hole) to provide relatively high plant output at low frequencies and relatively high passive attenuation. High plant output at low frequencies is gained, for example, by a high impedance front to back cavity PEQ hole (a small area PEQ hole has a lower cut-off frequency than a larger area PEQ hole). This leads to a higher system dynamic range at low frequencies. In some implementations, the system overloads at a higher pressure level at low frequencies due to higher sensitivity of the plant at low frequencies.

Other features and advantages of the invention are apparent from the following description, and from the claims.

DESCRIPTION

There are a variety of different types of personal active noise reduction (ANR) devices, i.e., devices that are structured to be at least partly worn by a user in the vicinity of at least one of the user's ears to provide ANR functionality for at least that one ear. For example, personal ANR devices may include headphones, communications headsets (e.g., including boom microphones), earphones, earbuds, wireless headsets (also known as "earsets"), and ear protectors with various designs and features. Some devices provide for communication, including two-way audio communications or one-way audio communications (i.e., acoustic output of audio electronically provided by another device), or no communications, at all. Some devices have wired or wireless connections between portions of the device or to other devices.

Figure 1:
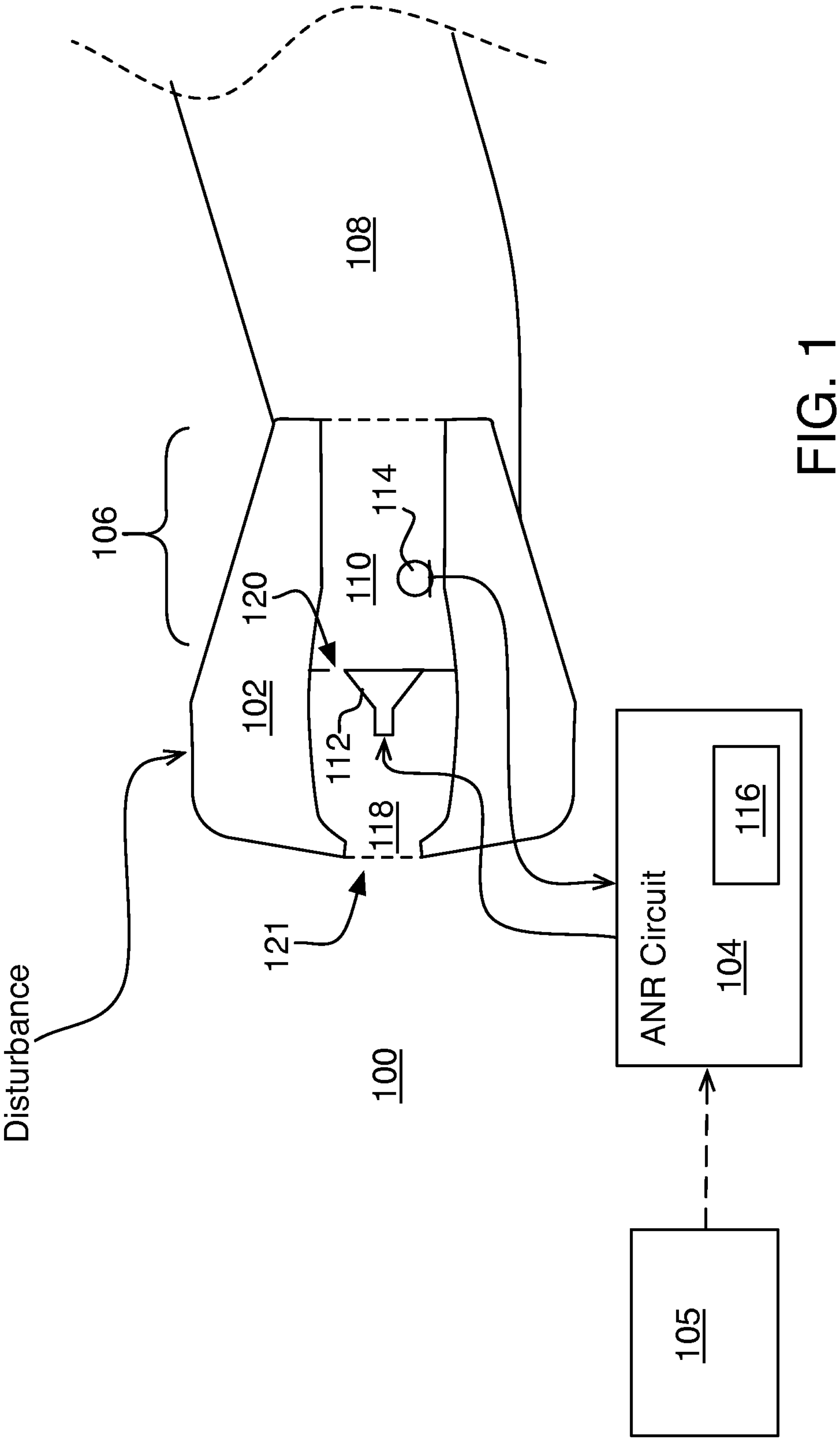
FIG. 1 is a schematic diagram of an earphone assembly.

Referring to FIG. 1, an example of an earphone assembly 100 for these and other devices (including devices with a single earphone or a pair of earphones) includes an earpiece 102 that is configured to be worn by a user, and ANR circuitry 104, which may be included within the earpiece 102 or in communication with components in the earpiece 102 (e.g., over a wired or wireless electronic connection). A source 105 provides an input signal to the ANR circuitry 104, such as pass-through audio to be delivered to the user through the earpiece 102. For example, the user may wear a personal ANR device to be able to hear the pass-through audio without the intrusion of noise sounds or acoustic disturbances. The pass-through audio may be, for example, a playback of recorded audio, transmitted audio, or any of a variety of other forms of audio that the user desires to hear. In support of the operation of the ANR circuitry 104, the source 105, or other components, earphone assembly 100 may further incorporate additional components (not shown) such as a communications interface, storage devices, a power source, and/or a processing device.

The earpiece 102 has a tip portion 106 (e.g., an earbud tip) that is configured to form at least some degree of acoustic seal around an outer portion of the ear canal 108 of the user's ear when the tip portion 106 is inserted at least partially into the ear canal 108. In some implementation, the tip portion 106 is made of a material that conforms to and presses outward against the inner walls of the ear canal 108, and/or has a shape that facilitates a seal for different sizes of the ear canal 108 (e.g., a conical shape). This acoustic seal enables an inner cavity 110 and the ear canal 108 to form an acoustic environment that supports the plant that is to be controlled by the ANR circuitry 104. The input to the plant corresponds to the sound pressure waves generated by an acoustic driver 112 (e.g., a speaker) at one end of the inner cavity 110, and the output of the plant corresponds to the pressure waves within the acoustic environment as recorded by a microphone 114 within the inner cavity 110. These recorded pressure waves include not only the sound pressure waves that were generated by the acoustic driver 112, but also include any undesired "noise" sound pressure waves that leak into the acoustic environment and any pressure changes within the acoustic environment caused by movement of the earpiece 102. The plant is electrically coupled to the ANR circuitry 104 via an electrical input signal provided to the acoustic driver 112, and an electrical output signal provided by the microphone 114, and the plant is characterized by a transfer function between these electrical input and output signals.

The ANR circuitry 104 includes a pressure-related disturbance (PRD) detector 116, which enables the ANR circuitry 104 to detect onset of potential pressure-related disturbances and respond to prevent pressure-related disturbances having significant effects. The PRD detector 116 is configured to detect a change in pressure within the ear canal 108 caused by movement of the earpiece 102. The ANR circuitry includes components that control the loop gain of a feedback loop in response to the detected change in pressure. The PRD detector 116 is described in more detail below (with reference to FIGS. 2A and 2B).

The acoustic environment of the inner cavity 110 and the ear canal 108 is substantially acoustically isolated from an outer cavity 118 that is exposed to the environment external to the earpiece 102. In addition to active noise reduction provided by the ANR circuitry 104, some degree of passive noise reduction (PNR) may also be provided by the structure the earpiece 102 attenuating sound pressure waves that leak into the acoustic environment. For example, in some implementations, there is a PEQ hole 120 that allows air to pass between the inner cavity 110 and the outer cavity 118. The PEQ hole 120 is configured to have relatively high acoustic impedance, providing relatively high acoustic isolation between the inner cavity 110 and the outer cavity 118. In some implementations, other structures having relatively low acoustic impedance can be included at the ends of the inner cavity 110 and/or outer cavity 118. For example, an acoustically transparent screen, grill or other form of perforated panel may be positioned near the outer openings of the inner cavity 110 and outer cavity 118 in a manner that obscures the cavities from view for aesthetic reasons and/or to protect components within the earpiece 102 from damage. In some examples, a screen at either opening is selected to have a specific acoustic resistance.

The PEQ hole 120 enables pressure within the inner cavity 110 to equalize with the pressure of the outer cavity 118 and the environment external to the earpiece 102, which is exposed to the outer cavity 118 through a port 121, when the earpiece 102 is placed in the user's ear. The port 121 may be acoustically resistive and/or reactive, depending on the particular acoustic needs of the earpiece. The acoustic resistance of the PEQ hole 120 is determined by its diameter. A smaller diameter corresponds to more passive noise reduction and lower-frequency plant output, but slower pressure equalization. A larger diameter, corresponding to faster pressure equalization, will also mitigate some degree of pressure-related disturbances, at the expense of some combination of acoustic dynamic range, loop gain, and passive attenuation. For example, the disturbances include over-pressure disturbances caused by movement of the earpiece 102 that reduces the volume of the acoustic environment (e.g., pushing the tip portion 106 into the ear), or under-pressure disturbances caused by movement of the earpiece 102 that increases the volume of the acoustic environment (e.g., pulling the tip portion 106 out of the ear). However, with the presence of the PRD detector 116, the ANR circuitry 104 is able to mitigate such disturbances without as much reliance on a larger PEQ hole 120. Therefore, in some implementations, the diameter of the PEQ hole 120 is selected to be relatively small to provide increased low frequency plant output (due to less front to back pressure cancellation around the driver 112), and a higher impedance transmission path to the ear canal 108 from the environment through the outer cavity 118 to the inner cavity 110 (which provides better passive attenuation through the increased acoustic impedance). For example, the area of the PEQ hole 120 can be selected to be about 0.5 $mm^2$.

Figure 2A:
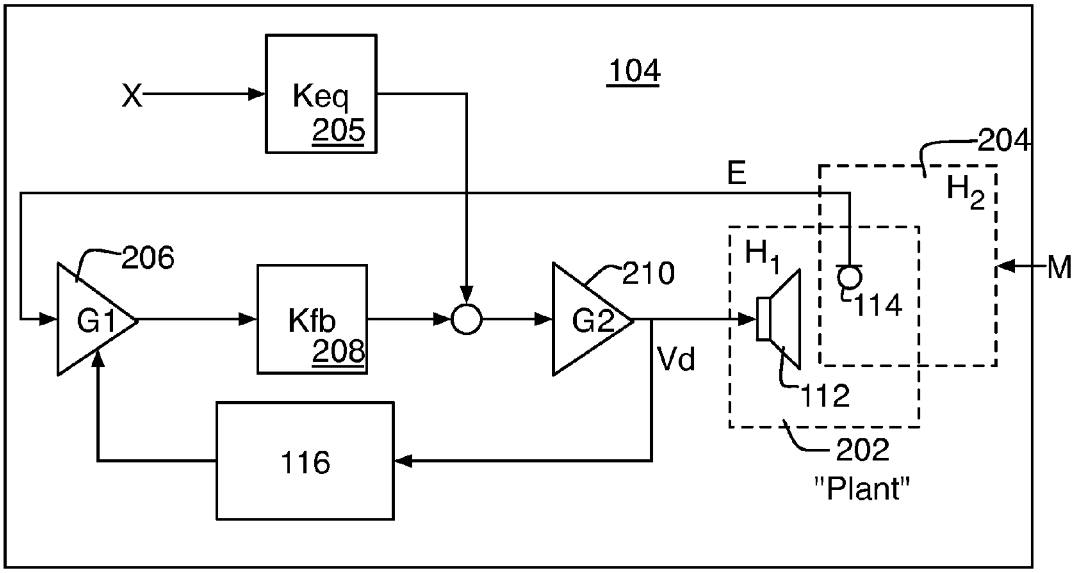
FIG. 2A is a circuit block diagram of ANR circuitry.

FIG. 2A shows an example of ANR circuitry 104 used to control a plant 202 characterized by the transfer function $H_1$ between the electrical input signal provided to the acoustic driver 112 and an electrical output signal provided by the microphone 114. As described above, this transfer function is affected by pressure-related disturbances to the acoustic environment of the inner cavity 110 and the ear canal 108. A transfer function $H_2$ represents a mechanically transmitted disturbance 204 to the ambient pressure within the acoustic environment (e.g., due to movement of the earpiece 102) based on the resulting pressure changes recorded by the microphone 114. These transfer functions are generally frequency dependent, having an associated magnitude and phase over a particular frequency spectrum. The magnitude of a particular disturbance 204 is represented by the factor M.

The ANR circuitry 104 receives an input voltage signal X (e.g., an audio signal) provided, for example, by the source 105. The input voltage signal X is passed through an equalization filter 205 having a transfer function $K_{eq}$. The equalized input represents the signal that is desired to be output from the plant when the active noise reduction is operating. In some implementations, there is no equalization filter, or it is set to pass the signal unchanged ($K_{eq}=1$). In some cases, no input voltage signal is provided (X=0), and the active noise reduction system reduces ambient noise or disturbances to provide a quiet acoustic environment (as sensed by the microphone 114). The ANR circuitry includes two loops: a feedback control loop, and feedback gain compressor loop that includes the PRD detector 116, as described in more detail below with reference to FIG. 2B.

The ANR circuitry 104 provides a driver voltage signal $V_d$ to the acoustic driver 112. The acoustic driver 112 transduces the voltage signal $V_d$ into a sound wave within the acoustic environment. The microphone 114 responds to the pressure at a particular location within the acoustic environment, and transduces the pressure into an electrical signal E. This signal E, corresponding to the plant output, is passed along a feedback path that starts with a variable gain amplifier (VGA) 206 having a gain $G_1$. The value of the gain $G_1$ is controlled by the feedback gain compressor loop. The output of the VGA 206 is sent to a feedback loop compensator 208 having a transfer function $K_{fb}$. The transfer function $K_{fb}$ is selected to provide active noise reduction over a desired noise reduction bandwidth, and is selected based on characteristics of the plant being controlled. In some implementations, the frequency domain representation of the transfer function $K_{fb}$ (the frequency response) generally has a broad band-pass shape with a low end at a relatively low frequency (e.g., around 1 Hz). The output of the compensator 208 is added to the equalized input, and the sum is amplified by an amplifier 210 having gain $G_2$ to provide the driver voltage signal $V_d$. Other arrangements of the ANR circuitry are also possible, including arrangements with additional loops (e.g., a feed-forward loop), or arrangements with signals added or subtracted at different locations within the loop (e.g., with the detected signal E subtracted directly from the input signal X).

The ANR circuitry 104 is configured to provide particular behavior based on the signal expressions corresponding to the particular arrangement of the feedback loop. In this example, the arrangement of the feedback loop in the ANR circuitry 104 yields the following expressions. The plant output signal E can be expressed (as a complex-valued signal) as follows:

$$E = \frac{MH_2}{1-L} + \frac{XK_{eq}G_2H_1}{1-L}$$

The term $L=G_1G_2H_1K_{fb}$ is commonly referred to as the feedback loop gain, and is a complex-valued frequency-dependent loop characteristic, with a magnitude that determines a frequency dependent gain response of the feedback loop and phase that determines a frequency dependent phase response of the feedback loop. The driver signal $V_d$ can be expressed (as a complex-valued signal) as follows:

$$V_d = \frac{MH_2G_1G_2K_{fb}}{1-L} + XK_{eq}G_2\left(1 + \frac{L}{1-L}\right)$$

This feedback control loop within the ANR circuitry 104 reacts to differences between the equalized input signal X and the compensated detected plant output signal E to try cancel such differences, over a frequency range where there is sufficient loop gain, by applying an appropriate driver signal $V_d$. Such differences can be caused, for example, by noise sounds (undesired sound pressure waves that leak into the acoustic environment of the plant), or by pressure-related disturbances to the plant itself. In the example of the acoustic environment of the inner cavity 110 and the ear canal 108, due to the small volume of this environment, there can be situations in which the magnitude of a pressure-related disturbance is significantly larger than the magnitude of a typical noise sound, especially in a low-frequency range. For example, the pressure change detected at the microphone 114 induced by a mechanical disturbance (e.g., pushing or pulling the tip portion 106 of the earpiece 102 in or out) is typically much greater than the amplitude of a pressure wave of ambient noise that propagates to the microphone 114. When the resulting disturbance to the plant is large enough, the feedback loop stability margin can decrease to the point where an instability or oscillation condition will occur.

The feedback gain compressor loop that includes the PRD detector 116 mitigates this situation by detecting the pressure-related disturbance and dynamically lowering the feedback loop gain to extinguish or squelch any oscillation that may result from this pressure-related disturbance to the plant. The PRD detector 116 detects the pressure-related disturbance based on the magnitude of the driver signal $V_d$, which is provided as an input to the PRD detector 116. The magnitude of $V_d$ is indicative of a reaction by the feedback loop to any disturbance to the plant, whether it is due to an ambient acoustic disturbance (acoustic noise generated external to the earpiece 102) or due to a mechanical disturbance (someone tapping, pushing, or pulling on the earpiece 102 when it is seated in the canal 108). The magnitude M of the disturbance 204 appears in the expression above for $V_d$, and affects the magnitude of $V_d$ in the frequency range where the feedback loop gain is high enough. Generally, feedback loop instabilities result from excessive feedback loop gain at a particular frequency, or inadequate phase margin where the loop gain is unity (as described in more detail with reference to FIGS. 4A and 4B). Lowering the feedback loop gain by a determined amount restores stability. The feedback gain compressor loop lowers the feedback loop gain by lowering the gain of any component within the loop, and in this example, by lowering the gain of the VGA 206 from its nominal gain setting. In other examples, the feedback gain compressor loop can be configured to provide a signal to another form of gain compensation circuitry equivalent to the VGA 206, such as circuitry within a loop compensator that responds to a control input by shifting the magnitude of at least a low frequency portion of the loop compensator frequency response.

Some implementations of the PRD detector 116 incorporate at least one technique for distinguishing between a pressure change caused by an external noise sound and a pressure change caused by movement of the earpiece 102. For example, one technique for distinguishing between these causes of pressure change is to compare the magnitude of $V_d$ to a threshold. The value of the threshold is selected to distinguish between: the (relatively smaller) pressure change caused by the expected maximum magnitude of an acoustic pressure wave of an external noise sound that leaks into the acoustic environment, and the (relatively larger) pressure change caused by an instability-inducing over-pressure or under-pressure disturbance (from movement of the earpiece 102). Another technique for distinguishing between these causes of pressure change is to filter the signal of $V_d$ using a low-pass filter. The cutoff frequency of the low-pass filter is selected to distinguish between: the (relatively higher) frequency of an acoustic pressure wave of an external noise sound, and the (relatively lower) frequency of pressure change caused by an instability-inducing over-pressure or under-pressure disturbance (from movement of the earpiece 102).

Figure 2B:
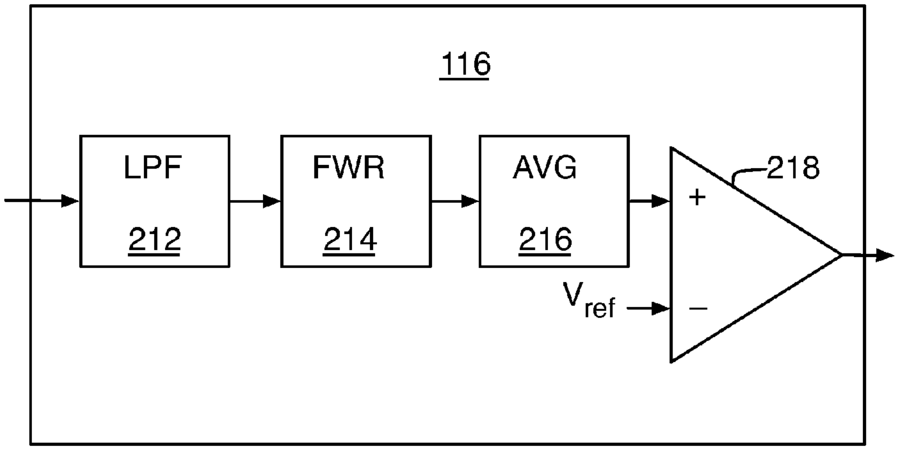
FIG. 2B is a circuit block diagram of a PRD detector.

FIG. 2B shows an example of circuitry for the PRD detector 116. This example includes components for both techniques described above for distinguishing between the different causes of pressure change. A low-pass filter 212 ensures the feedback gain compressor loop responds only to disturbances with a frequency lower than the lowest expected frequency of an external noise sound. For example, the cutoff frequency of the low-pass filter 212 can be selected to be about 1-10 hz. Alternatively, in implementations that don't use the frequency for distinguishing the different causes of pressure change, the low-pass filter is not included in the PRD detector 116.

In this example, the PRD detector 116 also includes a full wave rectifier (FWR) 214, an averaging component 216, and a comparator 218. Together the FWR 214 and averaging component 216 provide a signal $V_d'$ to the comparator 218 that represents the amplitude of the oscillating output of the low-pass filter 212. The FWR 214 generates a signal that approximately sustains the peak voltage of the envelope of the output of the low-pass filter 212. The averaging component 216 further smoothes the output of the FWR 214. The comparator 218 compares the output $V_d'$ of the averaging component 216 to a reference value $V_{ref}$ and outputs a value of HIGH (e.g., a high voltage) if $V_d'>V_{ref}$ and a value of LOW (e.g., a low voltage) if $V_d'<V_{ref}$. When the output of the comparator 218 is LOW, the nominal gain $G_1$ of the VGA 206 is unity (0 dB); and when the output of the comparator 218 is HIGH, the gain $G_1$ of the VGA 206 is reduced by a predetermined amount (e.g., by a value of around −12 dB). In this example, the comparator 216 also has a configurable attack set time which represents a delay between the time the condition $V_d'>V_{ref}$ first occurs and the time the output transitions from LOW to HIGH (if the condition still holds), and a configurable decay set time which represents the delay between the time the $V_d'<V_{ref}$ condition first occurs and the time the output transitions from HIGH to LOW (if the condition still holds). These delay times may be set to their minimum values, or one or both of them may be set higher to ignore short-lived changes in the comparator condition and reduce the potential for frequent switching of the gain value $G_1$.

The value of $V_{ref}$ is selected to correspond to a threshold near the onset of instability. The nominal feedback loop gain is already low enough so that an acoustic disturbance of an external noise sound would not cause instability. The nominal feedback loop gain is also low enough so that relatively small movement of the earpiece 102 within a normal expected range (e.g., due to different fits of the earpiece 102 for different users) do not cause pressure-related disturbances large enough to trigger the gain reduction. The large response of the feedback loop to a pressure change caused by an instability-inducing over-pressure or under-pressure disturbance leads to the onset of unstable oscillation and $V_d'>V_{ref}$. The lowered loop gain increases the stability margin of system and stops the growing oscillation.

Figure 3:
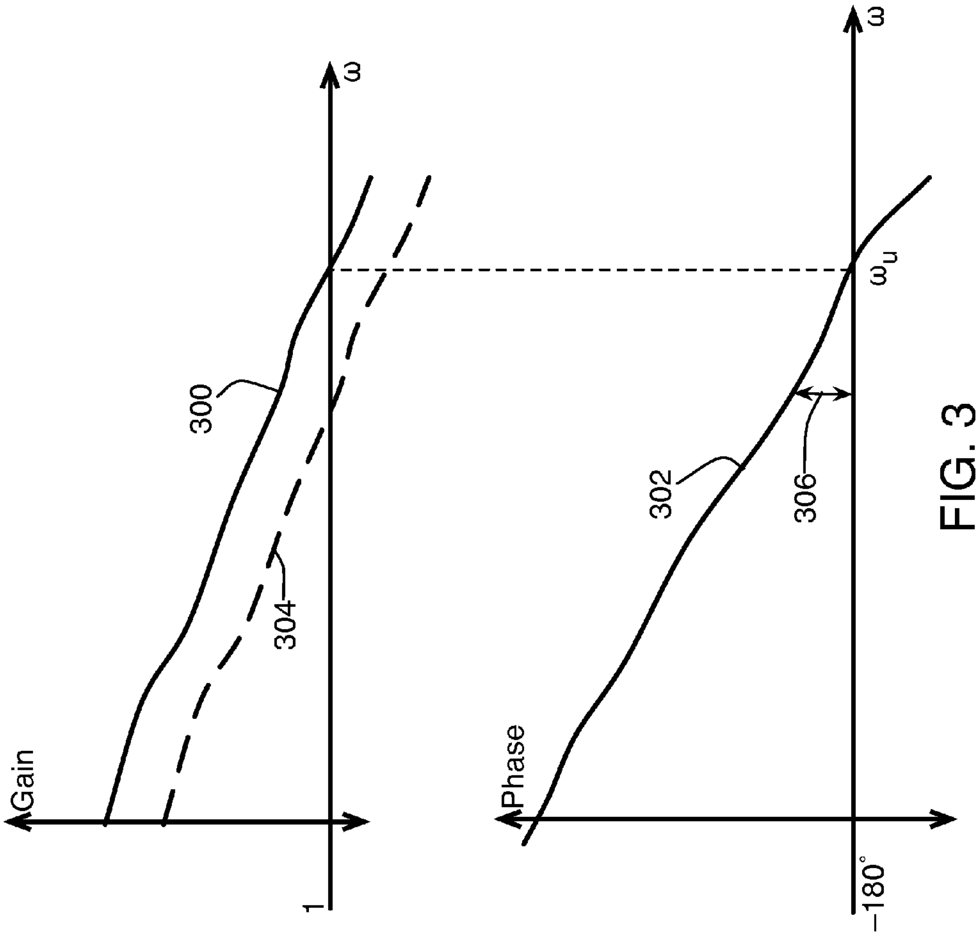
FIG. 3 is a graph of gain and phase margin.

Referring to FIG. 3, an example of a feedback loop gain and phase response illustrates an unstable situation in the feedback loop of the ANR circuitry 104. In particular, the feedback loop is in an unstable situation due to the solid gain curve 300 being equal to 1 and the solid phase curve 302 being equal to −180° at the same frequency $\omega_u$. In this situation, the phase margin is 0°, causing instability. In some implementations, the feedback gain compressor loop mitigates this instability by reducing the feedback loop gain when the average magnitude of the rectified envelope of the driver signal $V_d$ exceeds a threshold. In particular, the threshold and the amount by which the gain is reduced are selected to avoid a potential instability condition. The dashed gain curve 304 is the result of an overall reduction of the feedback loop gain. Since the phase curve 302 is not changed by reducing the magnitude of the gain, reducing the overall loop gain results in an increased phase margin 306, returning the feedback loop to a stable operating state.

Figure 4A:
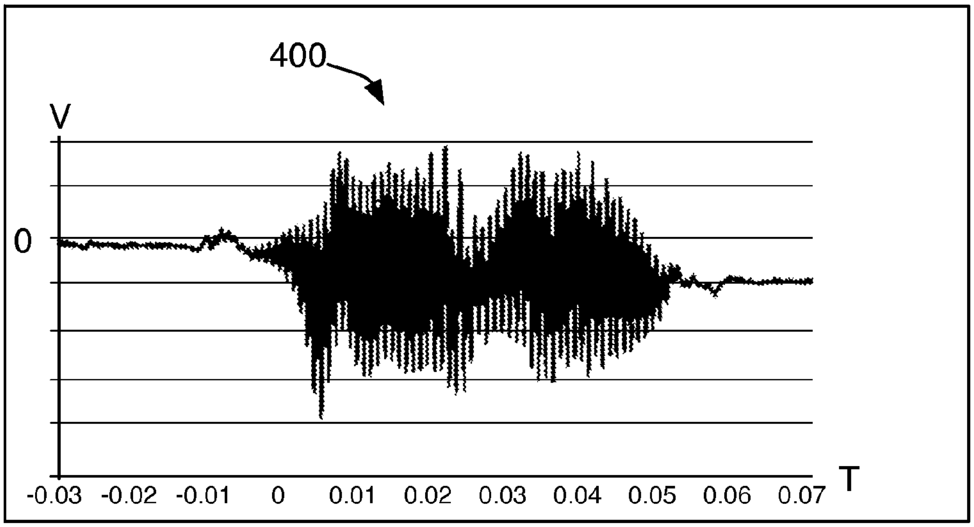
FIGS. 4A and 4B are plots of driver signals with and without feedback loop gain compression, respectively.
Figure 4B:
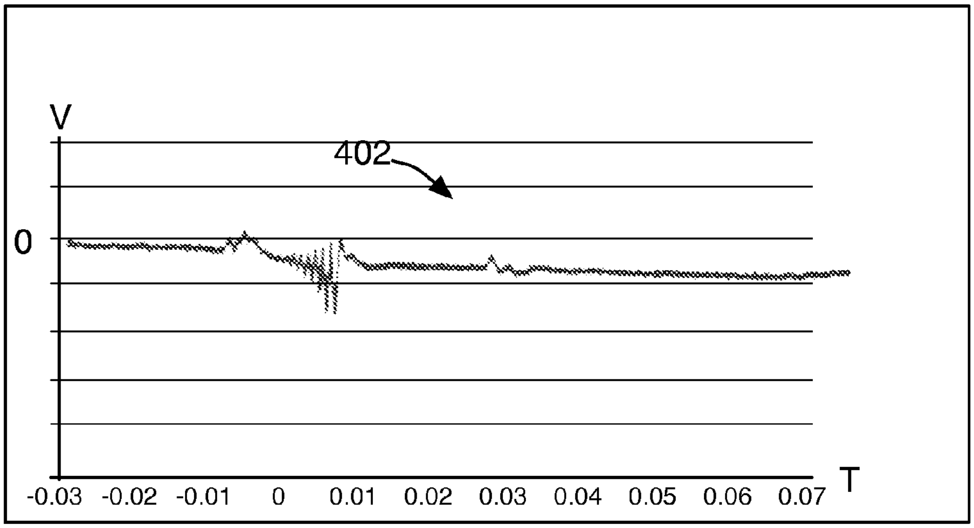

Referring to FIG. 4A, a plot 400 shows an example of typical behavior of the driver signal $V_d$ in response to a mechanical disturbance or "buffet event" that corresponds to a temporary (and relatively rapid with respect to the PEQ/acoustic cavity pressure time constant) forced mechanical movement of the earpiece 102 into or out of the ear, without the feedback gain compressor loop being included in the ANR circuitry 104 (or with the threshold set to a large enough value so that the gain reduction is not engaged). In this example, the input signal X is set to zero and there is relatively constant ambient noise that is being actively reduced by the ANR circuitry 104. The buffet event triggers an oscillation in the voltage that lasts approximately 50 ms during which the feedback loop is unstable and inoperative. Not only is the ANR circuitry 104 unable to perform active noise reduction during this event, but the acoustic driver 112 also emits a brief but potentially loud ringing noise that may distress a user. Referring to FIG. 4B, a plot 402 shows an example of a suppressed oscillation of the voltage under the same conditions as in plot 400, but when the feedback gain compressor loop is configured to engage the gain reduction in response to the onset of the oscillation detected by the PRD detector 116.

A variety of other implementations are possible. In some implementations, a microcontroller or digital signal processor is used to implement some or all of the functions of the ANR circuitry 104. The above description focuses on a single channel of an in-ear headphone system. However, the system described above can be extended to two or more channels.

Although described in the context of an in-ear ANR system, the approaches described above can be applied in other situations. For example, the approaches can be applied to over-the-ear or on-the-ear ANR headphones or other audio feedback situations, particularly when characteristics of a plant being controlled may change due to pressure-related disturbances, for example the audio characteristics of a room or a vehicle passenger compartment may be disturbed (e.g., when a door or window is opened).

It is to be understood that the foregoing description is intended to illustrate and not to limit the scope of the invention, which is defined by the scope of the appended claims. Other embodiments are within the scope of the following claims.

What is claimed is:

1. An apparatus, comprising:

an earpiece configured to form an acoustic seal around a portion of an acoustic environment; and active noise reduction circuitry including detection circuitry configured to processes a signal representative of a change in pressure within the acoustic environment to distinguish between a pressure change caused by an external noise sound and a pressure change caused by movement of the earpiece, and gain compensation circuitry configured to change a loop gain of a feedback loop in response to detection of the change in pressure when the change in pressure is determined to be caused by movement of the earpiece, wherein the detection circuitry comprises circuitry that compares a signal representative of the pressure change to a threshold that is selected to distinguish between a pressure change caused by an external noise sound and a pressure change caused by movement of the earpiece.

2. The apparatus of claim 1, wherein the circuitry that compares a signal representative of a pressure change to a threshold is configured to receive a signal from a first location within the feedback loop and compare a signal derived from the received signal to the threshold, and the gain compensation circuitry comprises a variable gain component within the feedback loop.

3. The apparatus of claim 1, wherein the detection circuitry comprises a low-pass filter that filters a signal representative of a pressure change, with a cutoff frequency selected to distinguish between a pressure change caused by an external noise sound and a pressure change caused by movement of the earpiece.

4. The apparatus of claim 1, wherein the detection circuitry comprises a first component that receives a signal from a first location within the feedback loop; and a second component that compares a signal derived from the received signal to the threshold.

5. The apparatus of claim 4, wherein the gain compensation circuitry comprises a variable gain component within the feedback loop.

6. The apparatus of claim 4, wherein the first component comprises a full wave rectifier.

7. The apparatus of claim 1, wherein the earpiece is configured to form an acoustic seal around an outer portion of an ear canal, and the acoustic environment comprises a cavity within the earpiece and the ear canal.

8. The apparatus of claim 7, wherein a portion of the earpiece configured to form an acoustic seal has a shape configured to form an acoustic seal.

9. The apparatus of claim 8, wherein the portion of the earpiece configured to form an acoustic seal has a conical shape.

10. The apparatus of claim 7, wherein a portion of the earpiece configured to form an acoustic seal consists essentially of a shape conforming material.

11. A method for controlling active noise reduction in an acoustic environment that includes an apparatus comprising an earpiece configured to form an acoustic seal around a portion of the acoustic environment, the method comprising:

processing a signal representative of a change in pressure within the acoustic environment to distinguish between a pressure change caused by an external noise sound and a pressure change caused by movement of the earpiece; and controlling a loop gain of a feedback loop in response to detection of the change in pressure when the change in pressure is determined to be caused by movement of the earpiece, wherein the processing of the signal representative of the pressure change comprises comparing the signal to a threshold that is selected to distinguish between a pressure change caused by an external noise sound and a pressure change caused by movement of the earpiece.

12. The method of claim 11, wherein comparing a signal representative of a pressure change to a threshold comprises receiving a signal from a first location within the feedback loop and comparing a signal derived from the received signal to the threshold, and controlling the loop gain includes using a variable gain component within the feedback loop.

13. The method of claim 11, wherein detecting the change in pressure comprises low-pass filtering a signal representative of a pressure change, with a cutoff frequency selected to distinguish between a pressure change caused by an external noise sound and a pressure change caused by movement of the earpiece.

14. The method of claim 11, wherein detecting the change in pressure comprises a first component receiving a signal from a first location within the feedback loop; and a second component comparing a signal derived from the received signal to the threshold.

15. The method of claim 14, wherein controlling the loop gain includes using a variable gain component within the feedback loop.

16. The method of claim 14, wherein the first component comprises a full wave rectifier.

17. The method of claim 11, wherein the earpiece forms an acoustic seal around an outer portion of an ear canal, and the acoustic environment comprises a cavity within the earpiece and the ear canal.

18. The method of claim 17, wherein a portion of the earpiece that forms an acoustic seal has a shape configured to form an acoustic seal.

19. The method of claim 18, wherein the portion of the earpiece that forms an acoustic seal has a conical shape.

20. The method of claim 17, wherein a portion of the earpiece that forms an acoustic seal consists essentially of a shape conforming material.

* * * * *